(12) United States Patent
Fujioka et al.

(10) Patent No.: US 12,414,345 B2
(45) Date of Patent: Sep. 9, 2025

(54) MANUFACTURING METHOD OF SEMICONDUCTOR DEVICE AND SEMICONDUCTOR WAFER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Hitoshi Fujioka, Nisshin (JP); Takeshi Koshiba, Nisshin (JP); Norihiro Togawa, Nisshin (JP); Takuji Arauchi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 415 days.

(21) Appl. No.: 18/163,423

(22) Filed: Feb. 2, 2023

(65) Prior Publication Data
US 2023/0290833 A1 Sep. 14, 2023

(30) Foreign Application Priority Data
Mar. 8, 2022 (JP) ................. 2022-035666

(51) Int. Cl.
*H01L 21/00* (2006.01)
*H01L 23/544* (2006.01)
(Continued)

(52) U.S. Cl.
CPC ....... *H10D 62/8325* (2025.01); *H01L 23/544* (2013.01); *H10D 12/031* (2025.01); *H01L 2223/54426* (2013.01)

(58) Field of Classification Search
CPC ............. H10D 62/8325; H10D 12/031; H10D 62/405; H10D 8/051; H01L 23/544;
(Continued)

(56) References Cited

U.S. PATENT DOCUMENTS

2007/0246702 A1* 10/2007 Andrieu ............... H10D 86/201
257/18
2015/0303119 A1* 10/2015 Tamaso ............... H10D 62/405
438/14

(Continued)

FOREIGN PATENT DOCUMENTS

JP 2017-168682 A 9/2017
JP 2019-056726 A 4/2019

*Primary Examiner* — Sheikh Maruf
(74) *Attorney, Agent, or Firm* — Posz Law Group, PLC

(57) ABSTRACT

A manufacturing method of a semiconductor device includes preparing a silicon carbide substrate, growing an epitaxial layer, and forming a structure. The silicon carbide substrate has an upper surface on which an alignment mark having a recessed shape is disposed, and a perpendicular line to the upper surface is inclined with respect to a [0001] direction toward a [11-20] direction. The epitaxial layer is grown on the upper surface and covers the alignment mark. The structure is formed on or above the upper surface at a position apart from the alignment mark by an interval P in the [11-20] direction along the upper surface. The interval P satisfies a relationship of D/tan θ<P<10D/tan θ, where D is a depth of the alignment mark and θ is an inclination angle of the perpendicular line with respect to the [0001] direction.

10 Claims, 16 Drawing Sheets

(51) Int. Cl.
  *H10D 12/01*  (2025.01)
  *H10D 62/832*  (2025.01)
(58) Field of Classification Search
  CPC . H01L 2223/54426; H01L 2223/54453; H01L 21/68; H01L 21/02378
  USPC .................................. 257/77; 438/105, 931
  See application file for complete search history.

(56) References Cited

U.S. PATENT DOCUMENTS

| | | | | |
|---|---|---|---|---|
| 2015/0333126 | A1* | 11/2015 | Fukui | H10D 12/031 |
| | | | | 257/77 |
| 2016/0056241 | A1* | 2/2016 | Miyazaki | H10D 30/63 |
| | | | | 438/285 |
| 2016/0071937 | A1* | 3/2016 | Fukui | H10D 12/481 |
| | | | | 257/77 |
| 2016/0118250 | A1* | 4/2016 | Tamaso | G03F 9/708 |
| | | | | 438/5 |
| 2017/0207214 | A1* | 7/2017 | Or-Bach | H01L 25/117 |
| 2017/0294415 | A1* | 10/2017 | Or-Bach | H01L 25/0756 |
| 2017/0365674 | A1* | 12/2017 | Lee | H10D 84/0151 |
| 2017/0372963 | A1* | 12/2017 | Huang | H01L 21/78 |
| 2019/0288026 | A1* | 9/2019 | Von Kaenel | H10F 39/1892 |
| 2020/0066648 | A1* | 2/2020 | Chen | G06F 30/392 |
| 2020/0066651 | A1* | 2/2020 | Burton | G03F 7/70741 |

* cited by examiner

MANUFACTURING METHOD OF SEMICONDUCTOR DEVICE AND SEMICONDUCTOR WAFER

CROSS REFERENCE TO RELATED APPLICATION

The present application claims the benefit of priority from Japanese Patent Application No. 2022-035666 filed on Mar. 8, 2022. The entire disclosure of the above application is incorporated herein by reference.

TECHNICAL FIELD

The present disclosure relates to a manufacturing method of a semiconductor device and also relates to a semiconductor wafer.

BACKGROUND

Conventionally, there has been known a silicon carbide (SiC) substrate that has an upper surface on which an alignment mark having a recessed shape is disposed.

SUMMARY

According to an aspect of the present disclosure, a manufacturing method of a semiconductor device includes preparing a SiC substrate, growing an epitaxial layer, and forming a structure. The SiC substrate has an upper surface on which an alignment mark having a recessed shape is disposed, and a perpendicular line that is perpendicular to the upper surface of the SiC substrate is inclined with respect to a [0001] direction toward a [11-20] direction. The epitaxial layer is grown on the upper surface of the SiC substrate so as to cover the alignment mark. The structure is formed on or above the upper surface of the SiC substrate at a position apart from the alignment mark by an interval P in the [11-20] direction along the upper surface of the SiC substrate. The interval P satisfies a relationship of $D/\tan\theta < P < 10D/\tan\theta$, where D is a depth of the alignment mark and $\theta$ is an inclination angle of the perpendicular line with respect to the [0001] direction.

According to another aspect of the present disclosure, a semiconductor wafer includes a base substrate, an epitaxial layer, and a structure. The base substrate is made of silicon carbide and has an upper surface on which an alignment mark having a recessed shape is disposed. A perpendicular line that is perpendicular to the upper surface of the base substrate is inclined with respect to a [0001] direction toward a [11-20] direction. The epitaxial layer is disposed on the upper surface of the base substrate and covers the alignment mark. The structure is disposed on the upper surface of the base substrate or an upper surface of the epitaxial layer. The structure is disposed at a position apart from the alignment mark by an interval P in the [11-20] direction along the upper surface of the base substrate. The interval P satisfies a relationship of $D/\tan\theta < P < 10D/\tan\theta$, where D is a depth of the alignment mark and $\theta$ is an inclination angle of the perpendicular line with respect to the [0001] direction.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
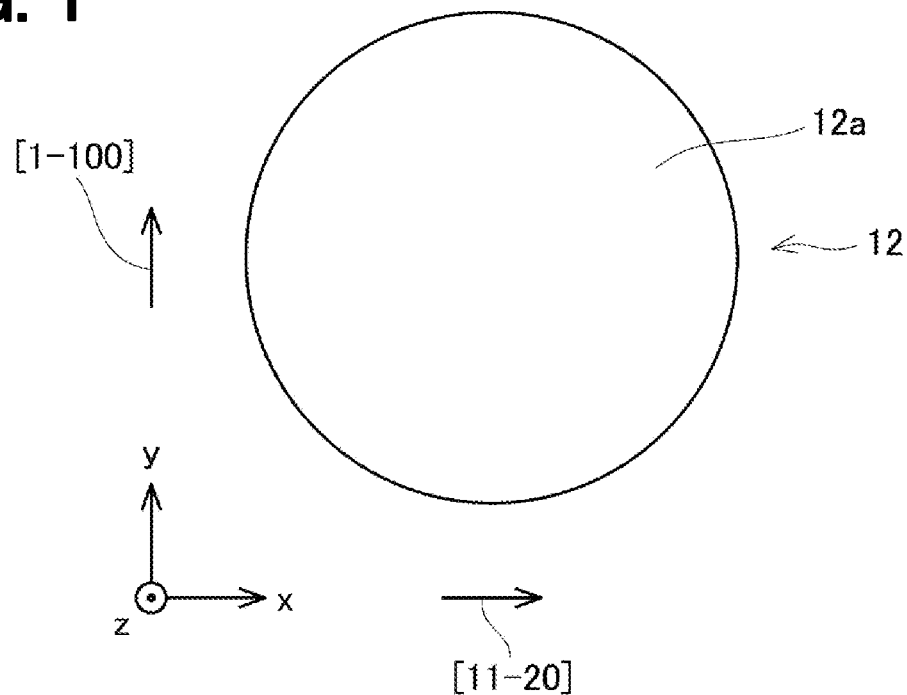
FIG. 1 is a plan view of a SiC substrate.

A SiC substrate may have an upper surface on which an alignment mark having a recessed shape is disposed. In the SiC substrate, the upper surface may be inclined with respect to a (0001) plane so that an off direction is a [11-20] direction. In other words, in the SiC substrate, a perpendicular line that is perpendicular to the upper surface of the SiC substrate may be inclined with respect to a [0001] direction toward the [11-20] direction. When an epitaxial layer is grown on the upper surface of the SiC substrate so as to cover the alignment mark, a facet surface inclined with respect to the upper surface of the SiC substrate may be formed at a position adjacent to the alignment mark in the [11-20] direction. The formation of the facet surface may be restricted by forming the alignment mark into a predetermined shape.

However, there may be cases where formation of a facet surface is not prevented even by forming the alignment mark into the predetermined shape. Moreover, due to various restrictions, it may not be possible to form an alignment mark into the predetermined shape and prevent formation of a facet surface. After an epitaxial layer is formed so as to cover the alignment mark, alignment may be performed using a recessed portion on an upper surface of the epitaxial layer (that is, a recessed portion formed following the alignment mark). At this time, if a facet surface formed on the epitaxial layer interferes with other structures, an alignment apparatus cannot correctly recognize the recessed portion on the upper surface of the epitaxial layer, and proper alignment cannot be performed.

According to an aspect of the present disclosure, a manufacturing method of a semiconductor device includes preparing a SiC substrate, growing an epitaxial layer, and forming a structure. The SiC substrate has an upper surface on which an alignment mark having a recessed shape is disposed, and a perpendicular line that is perpendicular to the upper surface of the SiC substrate is inclined with respect to a [0001] direction toward a [11-20] direction. The epitaxial layer is grown on the upper surface of the SiC substrate so as to cover the alignment mark. The structure is formed on or above the upper surface of the SiC substrate at a position apart from the alignment mark by an interval P in the [11-20] direction along the upper surface of the SiC substrate. The interval P satisfies a relationship of $D/\tan \theta < P < 10 D/\tan \theta$, where D is a depth of the alignment mark and $\theta$ is an inclination angle of the perpendicular line with respect to the [0001] direction.

Note that the preparing the SiC substrate may include bringing the SiC substrate with the alignment mark in a manufacturing facility or forming the alignment mark on the upper surface of the SiC substrate.

The forming the structure on or above the upper surface of the SiC substrate may be performed before or after the growing the epitaxial layer. In other words, the structure may be formed on the upper surface of the SiC substrate before the forming the epitaxial layer or the structure may be formed above the upper surface of the SiC substrate after the forming the epitaxial layer (that is, on an upper surface of the epitaxial layer).

According to experiments by the inventors, it has been found that a width of a facet surface formed adjacent to the alignment mark when the epitaxial layer is grown to cover the alignment mark can be estimated by the inclination angle $\theta$ (so-called, an off angle) of the upper surface of the SiC substrate with respect to the direction and the depth D of the alignment mark. In general, the width of the facet surface is narrower than a width W calculated by an equation of $W = D/\tan \theta$. Therefore, by setting the interval P so as to satisfy a relationship of $D/\tan \theta < P$, it is possible to restrict the facet surface from interfering with the structure. If the interval P is unnecessarily widened, an area occupied by the interval P becomes wider, which causes a decrease in the number of semiconductor devices manufactured from the SiC substrate. As described above, by setting the interval P so as to satisfy the relationship of $D/\tan \theta < P < 10 D/\tan \theta$ (that is, $W < P < 10W$), interference between the facet surface and the structure can be restricted without unnecessarily widening the interval P. Since the interference between the facet surface and the structure can be restricted, it is possible to perform proper alignment using the recessed portion on the upper surface of the epitaxial layer (that is, the recessed portion formed following the alignment mark).

According to another aspect of the present disclosure, a semiconductor wafer includes a base substrate, an epitaxial layer, and a structure. The base substrate is made of silicon carbide and has an upper surface on which an alignment mark having a recessed shape is disposed. A perpendicular line that is perpendicular to the upper surface of the base substrate is inclined with respect to a [0001] direction toward a [11-20] direction. The epitaxial layer is disposed on the upper surface of the base substrate and covers the alignment mark. The structure is disposed on the upper surface of the base substrate or an upper surface of the epitaxial layer. The structure is disposed at a position apart from the alignment mark by an interval P in the [11-20] direction along the upper surface of the base substrate. The interval P satisfies a relationship of $D/\tan \theta < P < 10 D/\tan \theta$, where D is a depth of the alignment mark and $\theta$ is an inclination angle of the perpendicular line with respect to the [0001] direction.

According to the semiconductor wafer described above, it is possible to perform proper alignment using the recessed portion on the upper surface of the epitaxial layer.

First Embodiment

Figure 2:
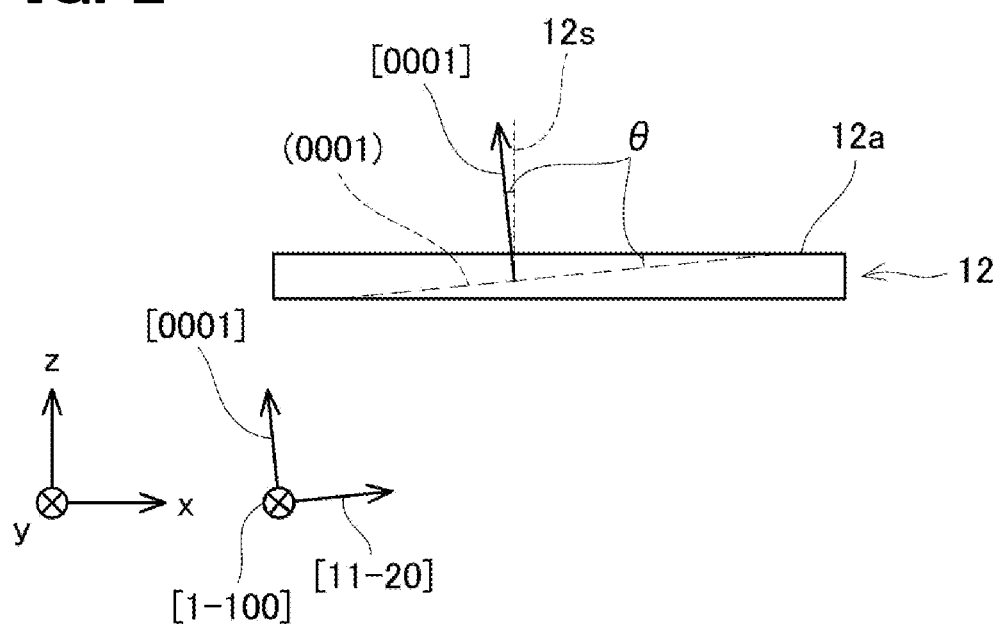
FIG. 2 is a cross-sectional view of the SiC substrate.

In a manufacturing method of a first embodiment, a semiconductor device is manufactured from a SiC substrate 12 illustrated in FIG. 1 and FIG. 2. The SiC substrate 12 is made of 4H—SiC. Hereinafter, a thickness direction of the SiC substrate 12 is referred to as a z-direction, one direction perpendicular to the z-direction is referred to as an x-direction, and a direction perpendicular to the z-direction and the x-direction is referred to as a y-direction. The x-direction and the y-direction are parallel to an upper surface 12a of the SiC substrate 12. As illustrated in FIG. 2, a [1-100] direction of the SiC substrate 12 matches the y-direction. A (0001) plane of the SiC substrate 12 is inclined by an off angle $\theta$ around the [1-100] direction with respect to the upper surface 12a of the SiC substrate 12. In other words, the (0001) plane is inclined with respect to the upper surface 12a in a cross section including a [11-20] direction and a direction. A perpendicular line 12s in FIG. 2 indicates a perpendicular line that is perpendicular to the upper surface 12a. Since the (0001) plane is inclined by the off angle $\theta$ with respect to the upper surface 12a, the perpendicular line 12s is inclined with respect to the [0001] direction by the off angle $\theta$ toward the [11-20] direction. Note that the off angle $\theta$ may be 10 degrees or less, or may be 5 degrees or less. For example, the off angle $\theta$ can be approximately 4 degrees. As illustrated in FIG. 1, when the upper surface 12a of the SiC substrate 12 is viewed from above, the x direction extends along the [11-20] direction.

Figure 3:
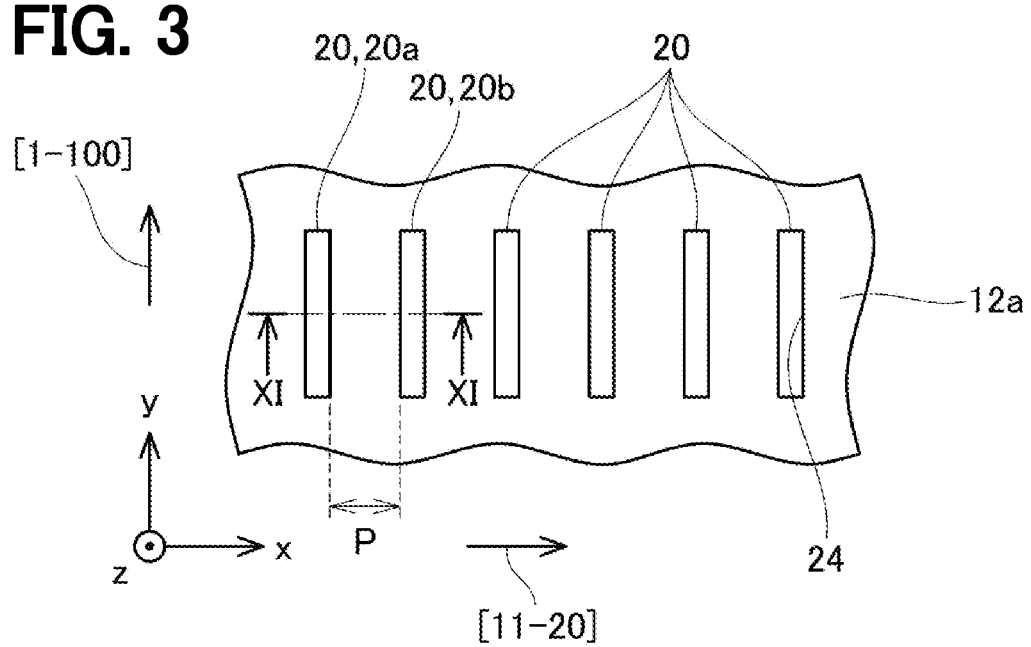
FIG. 3 is a plan view of alignment marks on an upper surface of the SiC substrate.

In the manufacturing method of the first embodiment, first, an alignment mark formation process is performed. In the alignment mark formation process, alignment marks 20 illustrated in FIG. 3 are formed on the upper surface of the SiC substrate 12. Each of the alignment marks 20 has a recessed shape disposed on the upper surface 12a of the SiC substrate 12. Each of the alignment marks 20 has long sides extending in the y-direction and short sides extending in the x-direction. Therefore, when the upper surface 12a of the SiC substrate 12 is viewed from above, a side surface 24 (that is, an edge portion) of each of the alignment marks 20 located in the [11-20] direction is perpendicular to the [11-20] direction. The alignment marks 20 are arranged with an interval P therebetween in the x-direction. Although not illustrated in FIG. 1, the upper surface 12a of the SiC substrate 12 has an element region in which a semiconductor element structure is formed and an outer region outside the element region. The outer region is a region that is removed when the SiC substrate 12 is divided into multiple semiconductor devices by dicing or the like. Each of the alignment marks 20 is formed in the outer region of the upper surface 12a of the SiC substrate 12.

Figure 4:
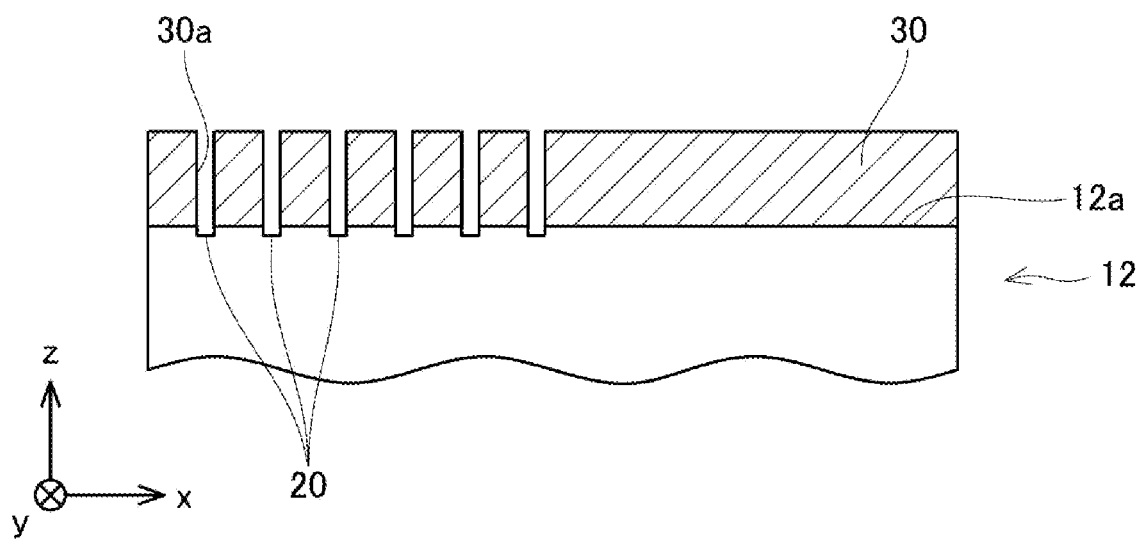
FIG. 4 is a cross-sectional view illustrating a first manufacturing method of the alignment marks.

In the alignment mark formation process, the alignment marks 20 can be formed by various methods. A first forming method of the alignment marks 20 will be described with reference to FIG. 4. In the first forming method, first, as illustrated in FIG. 4, a resist mask 30 having opening portions 30a is formed on the upper surface 12a of the SiC substrate 12. Next, the upper surface 12a of the SiC substrate 12 is etched by anisotropic etching through the opening portions 30a. Accordingly, the alignment marks 20 each having the recessed shape are formed in the respective opening portions 30a. After forming the alignment marks 20, the resist mask 30 is removed.

Figure 5:
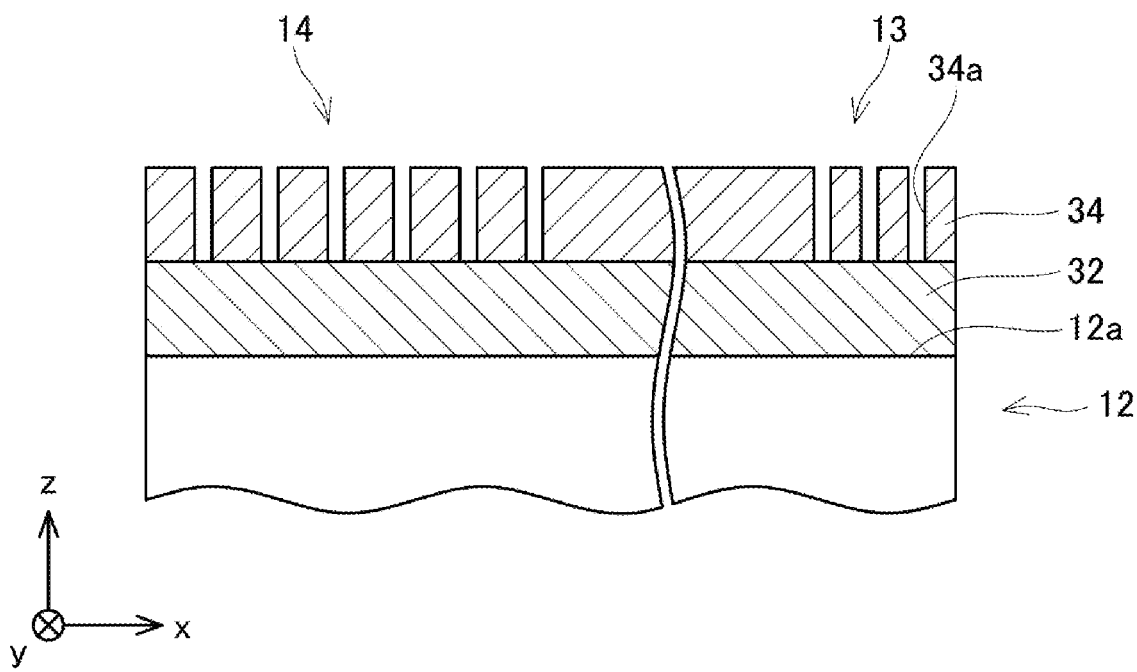
FIG. 5 is a cross-sectional view illustrating a process in a second forming method of the alignment marks.
Figure 6:
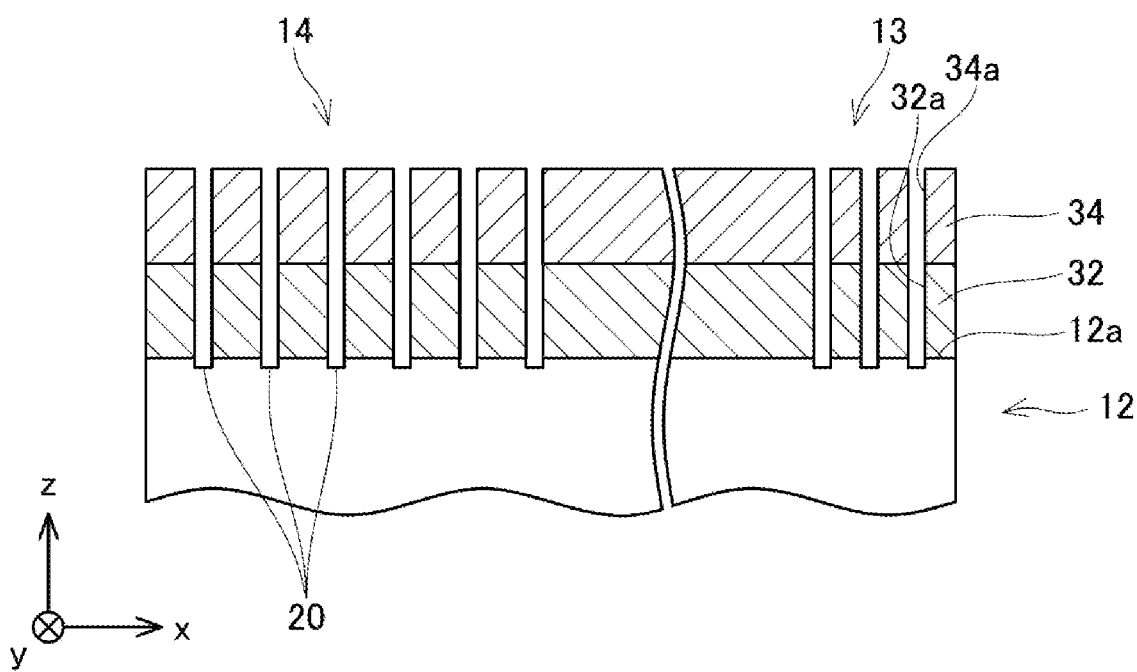
FIG. 6 is a cross-sectional view illustrating a process in the second forming method of the alignment marks, subsequent to the process illustrated in FIG. 5.
Figure 7:
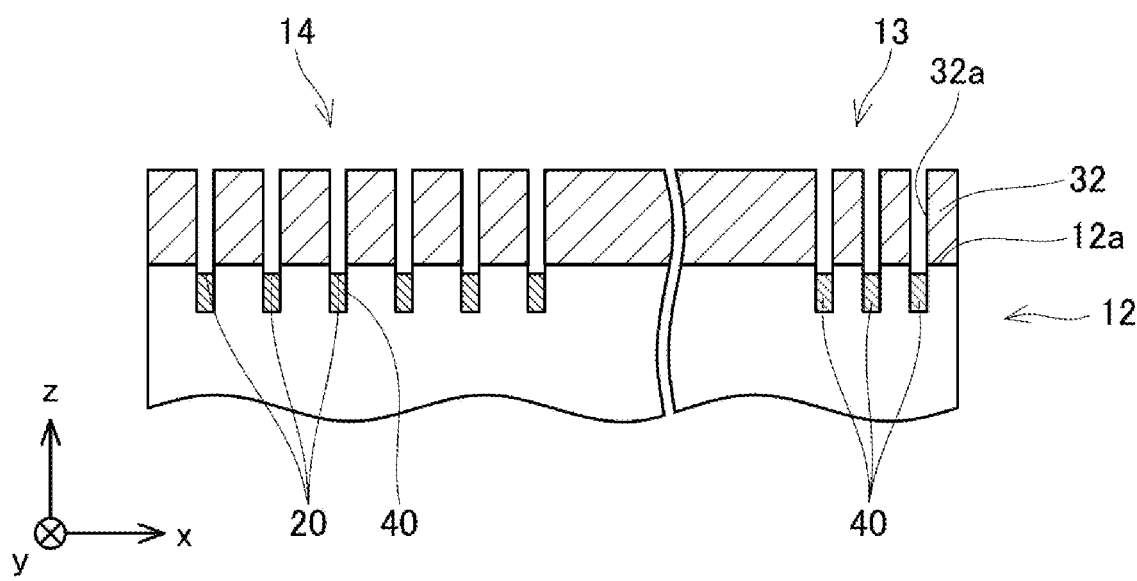
FIG. 7 is a cross-sectional view illustrating a process in the second forming method of the alignment marks, subsequent to the process illustrated in FIG. 6.

A second forming method of the alignment marks 20 will be described with reference to FIGS. 5 to 7. FIGS. 5 to 7 illustrate cross sections of the element region 13 and the outer region 14. In the second forming method, first, as illustrated in FIG. 5, a hard mask 32 (for example, a mask made of silicon oxide) is formed on the upper surface 12a of the SiC substrate 12. The hard mask 32 is a mask for controlling a range of ion implantation into SiC substrate 12. Next, a resist mask 34 having opening portions 34a is formed on the hard mask 32. Then, as illustrated in FIG. 6, the hard mask 32 is etched by anisotropic etching through the opening portions 34a. Accordingly, opening portions 32a are formed in the hard mask 32. Since the opening portions 32a are formed to reach the SiC substrate 12, the upper surface 12a of the SiC substrate 12 is over-etched when forming the opening portions 32a. Accordingly, recessed shapes are formed on the upper surface 12a of the SiC substrate 12. The recessed shapes formed in the outer region 14 become the alignment marks 20. After forming the opening portions 32a in the hard mask 32, the resist mask 34 is removed. Next, n-type or p-type impurity ions are implanted into the upper surface 12a of the SiC substrate 12 through the hard mask 32. Accordingly, as illustrated in FIG. 7, a diffusion layer 40 is formed in the SiC substrate 12 below the opening portions 32a. In the element region 13, the diffusion layer 40 is formed at required positions. In the outer region 14, the diffusion layer 40 is formed below the alignment marks 20. Even if the diffusion layer 40 is formed under the alignment marks 20, there is no particular problem. As described above, in the second forming method, the alignment marks 20 are formed by utilizing the phenomenon that the upper surface 12a of the SiC substrate 12 is over-etched when the opening portions 32a are formed in the hard mask 32 for ion implantation.

Figure 8:
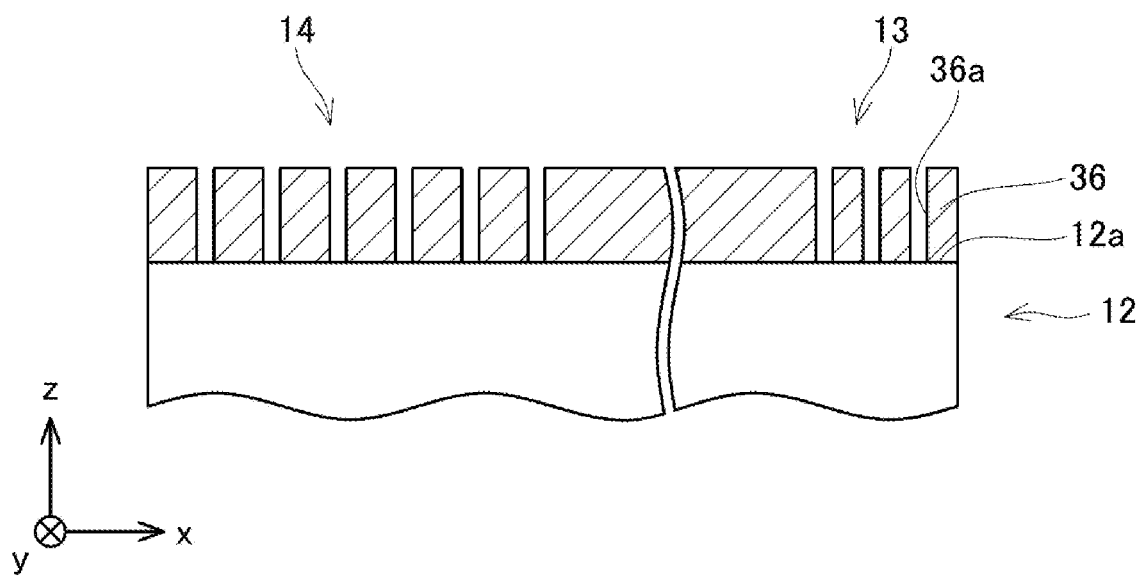
FIG. 8 is a cross-sectional view illustrating a process in a third forming method of the alignment marks.
Figure 9:
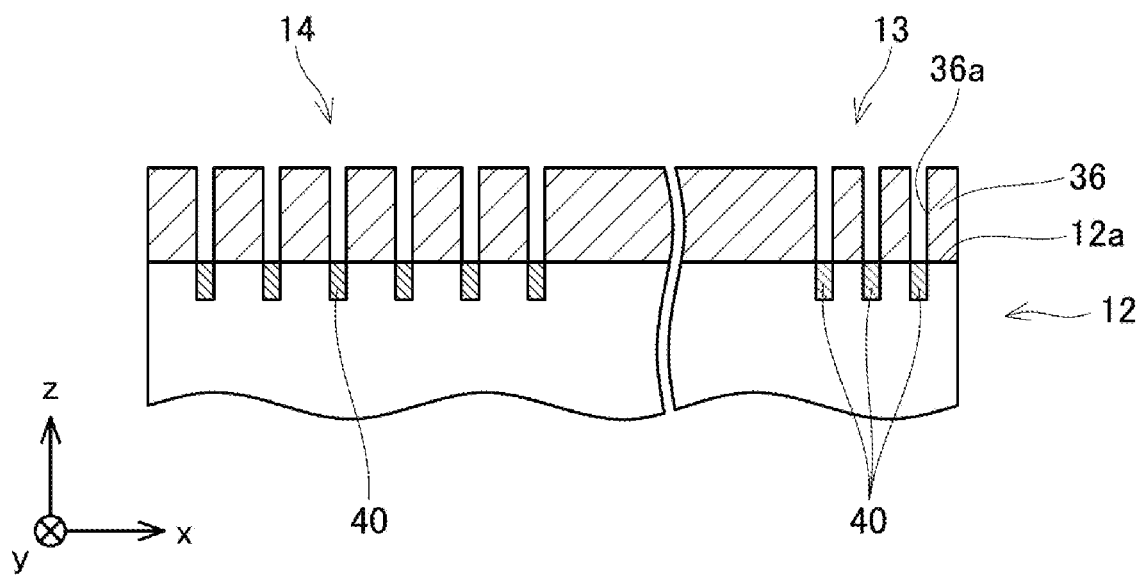
FIG. 9 is a cross-sectional view illustrating a process in the third forming method of the alignment marks, subsequent to the process illustrated in FIG. 8.
Figure 10:
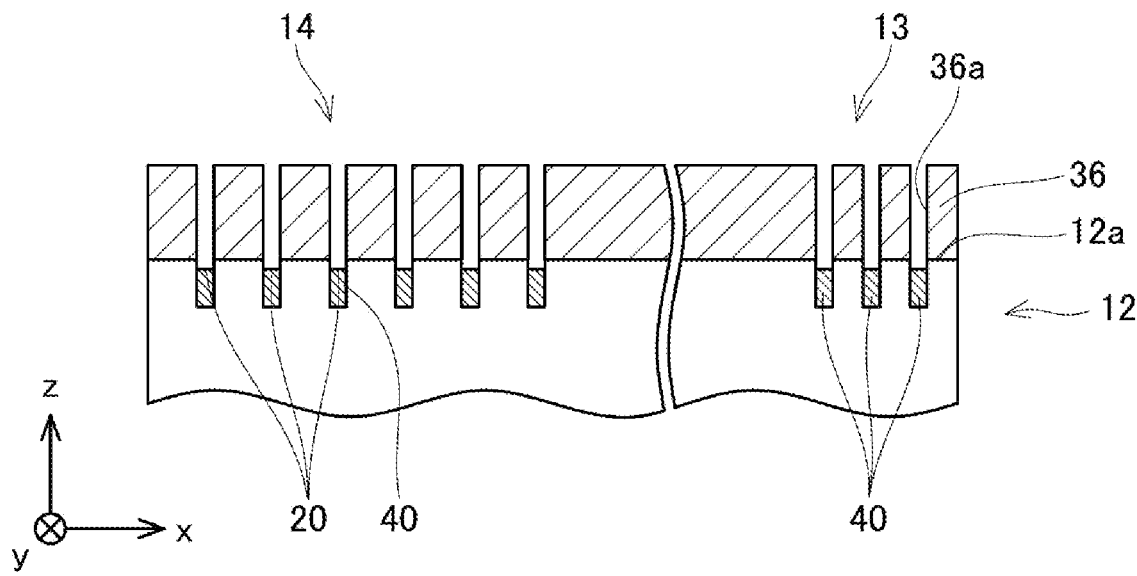
FIG. 10 is a cross-sectional view illustrating a process in the third forming method of the alignment marks, subsequent to the process illustrated in FIG. 9.

A third forming method of the alignment marks 20 will be described with reference to FIGS. 8 to 10. FIGS. 8 to 10 illustrate cross sections of the element region 13 and the outer region 14. In the third forming method, first, as illustrated in FIG. 8, a resist mask 36 having opening portions 36a is formed on the upper surface 12a of the SiC substrate 12. Next, n-type or p-type impurity ions are implanted into the upper surface 12a of the SiC substrate 12 through the resist mask 36. Accordingly, as illustrated in FIG. 9, a diffusion layer 40 is formed in the SiC substrate 12 below the opening portions 36a. In the element region 13, the diffusion layer 40 is formed at required positions. Also, in the outer region 14, the diffusion layer 40 is formed at a position where the alignment marks 20 are to be formed. Next, the SiC substrate 12 is etched by anisotropic etching through the opening portions 36a. Accordingly, as illustrated in FIG. 10, recessed shapes are provided on the upper surface 12a of the SiC substrate 12. The recessed shapes provided in the outer region 14 become the alignment marks 20. After forming the alignment marks 20, the resist mask 36 is removed.

Figure 11:
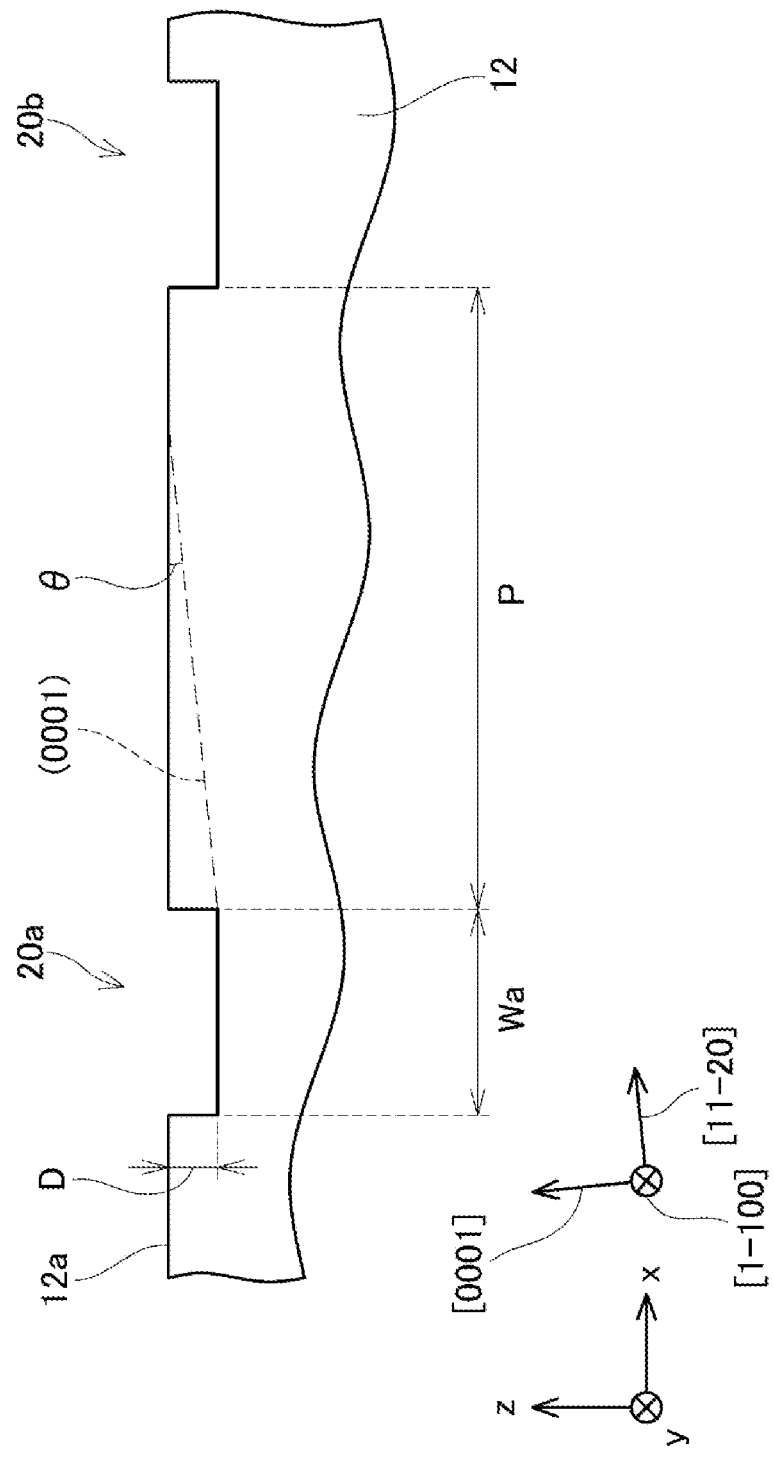
FIG. 11 is an enlarged cross-sectional view of the alignment marks.

FIG. 11 illustrates a cross-sectional view along line XI-XI of FIG. 3. In other words, FIG. 11 illustrates a cross-sectional view of alignment marks 20a and 20b of the alignment marks 20 along the x-direction. Although the alignment marks 20a and 20b are illustrated in FIG. 11, the other alignment marks 20 are also formed in the same shape as illustrated in FIG. 11. As illustrated in FIG. 11, a depth D of each of the alignment marks 20 is smaller than a width Wa of each of the alignment marks 20 in the x-direction. An interval P is provided between each of the alignment marks 20 in the x-direction.

Figure 12:
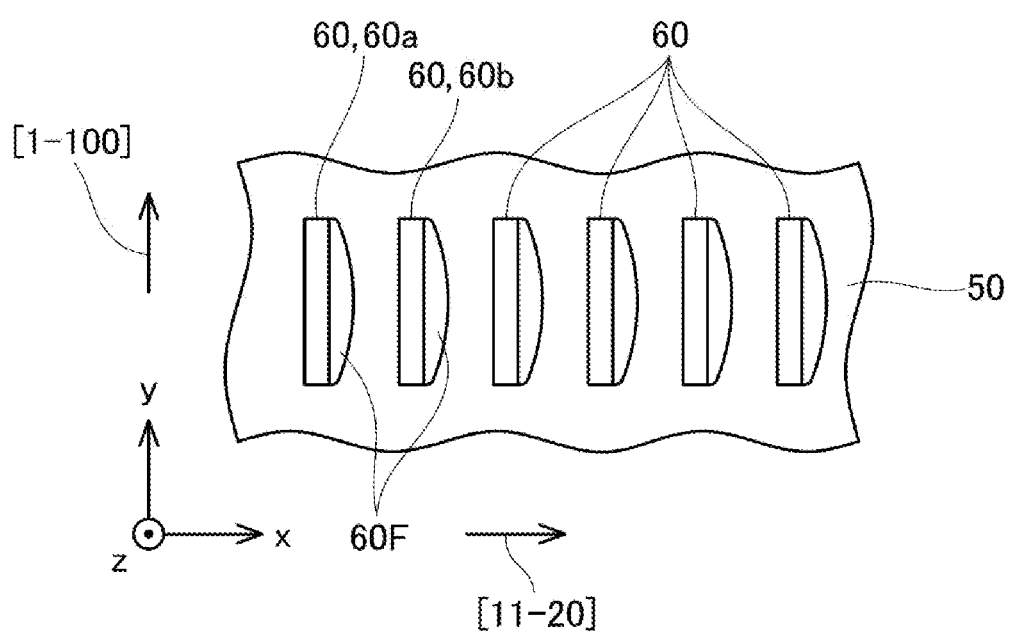
FIG. 12 is a plan view of alignment marks on an upper surface of a SiC layer.

In the manufacturing method of the first embodiment, an epitaxial growth process is performed after the alignment mark formation process. In the epitaxial growth process, a SiC layer 50 illustrated in FIG. 13 and the like is epitaxially grown on the upper surface 12a of the SiC substrate 12. The SiC layer 50 is formed to cover each of the alignment marks 20. When each of the alignment marks 20 is covered with the SiC layer 50, recessed shapes following the recessed shapes of the alignment marks 20 are formed on the upper surface of the SiC layer 50. The recessed shapes following the shapes of the alignment marks 20 and formed on the upper surface of the SiC layer 50 are hereinafter referred to as alignment marks 60. As illustrated in FIG. 12, a facet surface 60F is formed at a part of each of the alignment marks 60. Formation of the facet surface 60F will be described below.

Figure 13:
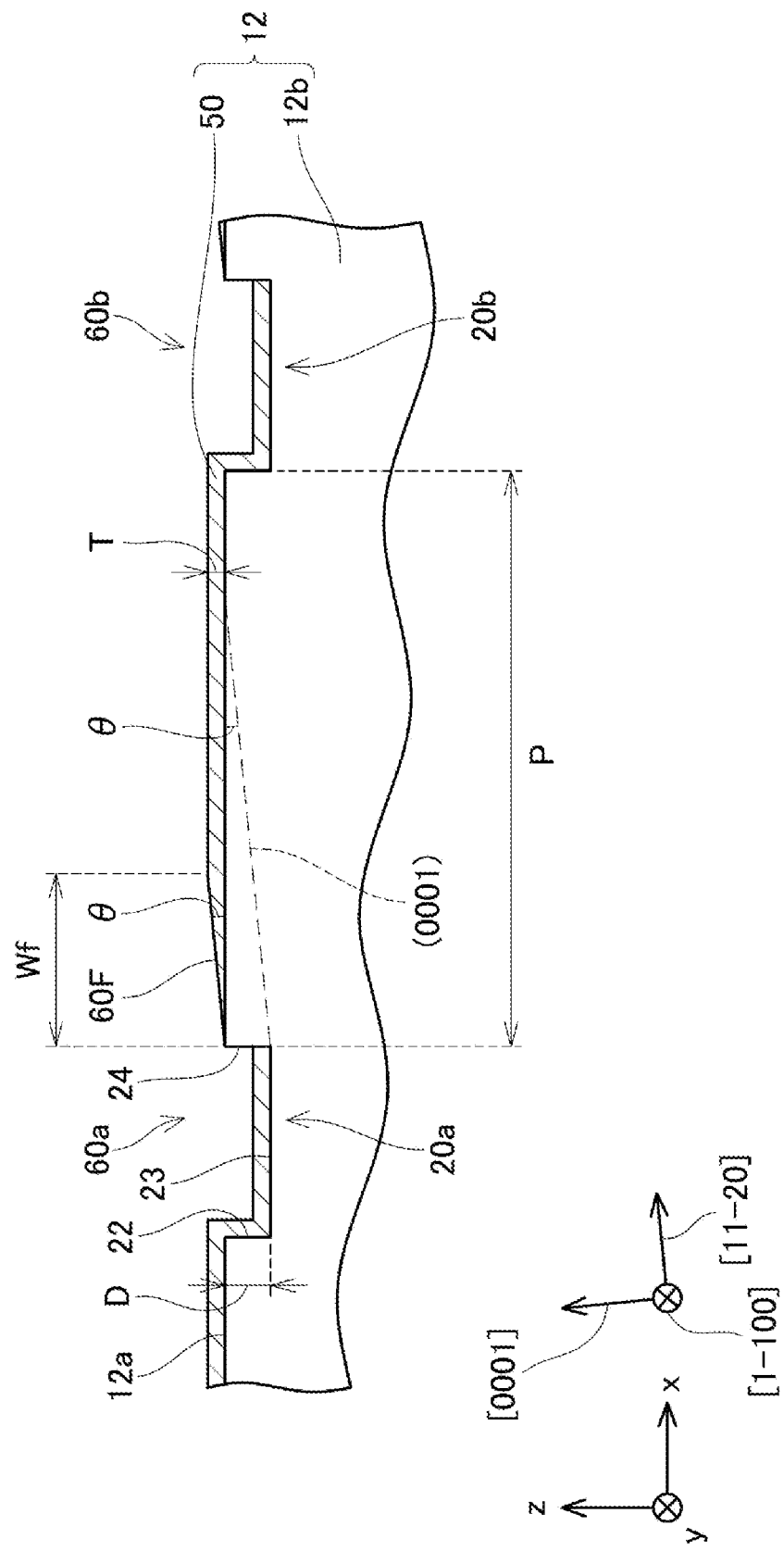
FIG. 13 is a cross-sectional view illustrating a process in an epitaxial growth process.

FIGS. 13 to 16 illustrate how the SiC layer 50 is epitaxially grown on the upper surface 12a of the SiC substrate 12 in the epitaxial growth process. In the following description, the SiC substrate 12 before the epitaxial growth process is referred to as a base substrate 12b, and the entirety of the base substrate 12b and the SiC layer 50 is referred to as the SiC substrate 12. As illustrated in FIG. 13, when the SiC layer 50 is grown on the base substrate 12b, the alignment marks 60 having recessed shapes following the recessed shapes of the alignment marks 20 are formed on the upper surface of the SiC layer 50. In the following description, the alignment mark 60 following the recessed shape of the alignment mark 20a may be referred to as an alignment mark 60a, and the alignment mark 60 following the recessed shape of the alignment mark 20b may be referred to as an alignment mark 60b. As illustrated in FIG. 13, the SiC layer 15 is grown to have a substantially uniform film thickness in a range extending over the upper surface 12a of the base substrate 12b, side surfaces 22 of the alignment marks 20 located in the [−1-120] direction, and bottom surfaces 23 of the alignment marks 20. Hereinafter, a film thickness of the SiC layer 50 on the upper surface 12a of the base substrate 12b (more specifically, a film thickness of the portion where the film thickness is uniform) is referred to as film thickness T. The SiC layer 50 hardly grows on the side surfaces 24 of the alignment marks 20 located in the [11-20] direction. Therefore, the SiC layer 50 does not grow uniformly on the upper surface 12a within a range adjacent to the alignment marks 20 in the [11-20] direction. In this range, the SiC layer 50 grows such that the film thickness of the SiC layer 50 increases with increase in the distance from the alignment marks 20, and a surface of the SiC layer 50 becomes parallel to the (0001) plane. The surface of the SiC layer 50 parallel to the (0001) plane is the facet surface 60F.

Figure 14:
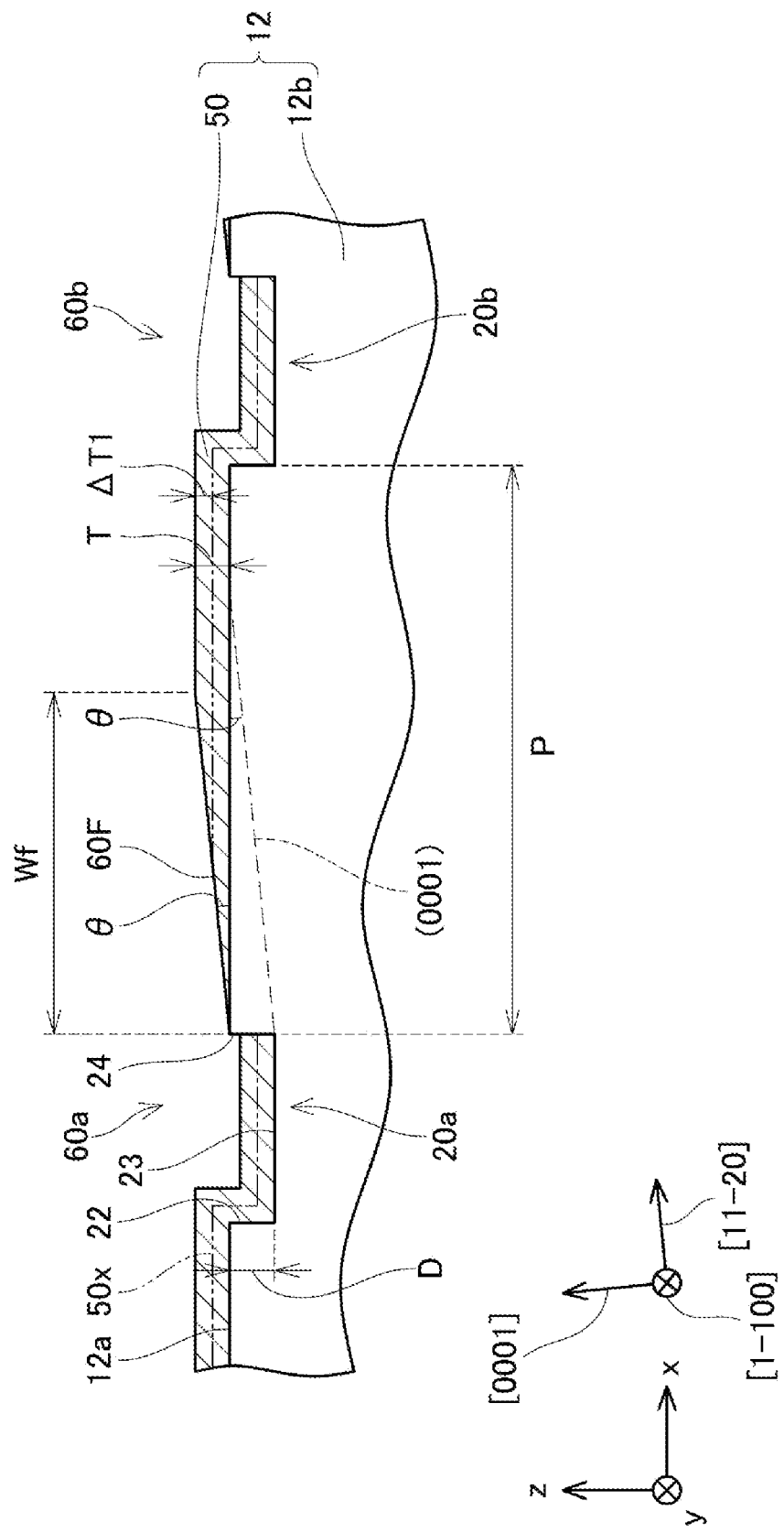
FIG. 14 is a cross-sectional view illustrating a process in the epitaxial growth process, subsequent to the process illustrated in FIG. 13.

When the film thickness T of the SiC layer 50 is further increased from a state illustrated in FIG. 13, a state illustrated in FIG. 14 is obtained. In FIG. 14, a virtual line 50x represents the surface of the SiC layer 50 in the state of FIG. 13, and a film thickness increase amount ΔT1 indicates a film thickness increased from the state of FIG. 13. As illustrated in FIG. 14, even if the film thickness T increases, the SiC layer 50 does not grow on the original facet surface 60F. Further, when the film thickness T increases, the SiC layer 50 grows so that the surface of the SiC layer 50 is parallel to the (0001) plane at a position adjacent to the original facet surface 60F in the [11-20] direction. That is, the facet surface 60F expands in the [11-20] direction. A width Wf in FIGS. 13 and 14 indicates the width of the facet surface 60F in the x-direction. As illustrated in FIGS. 13 and 14, the width Wf of the facet surface 60F increases with increase in the film thickness T. Thus, when the film thickness T is smaller than the depth D of the alignment marks 20, the width Wf of the facet surface 60F increases with increase in the film thickness T. In this case, the width Wf of the facet surface 60F relatively accurately satisfies the relationship of Wf=T/tan θ.

Figure 15:
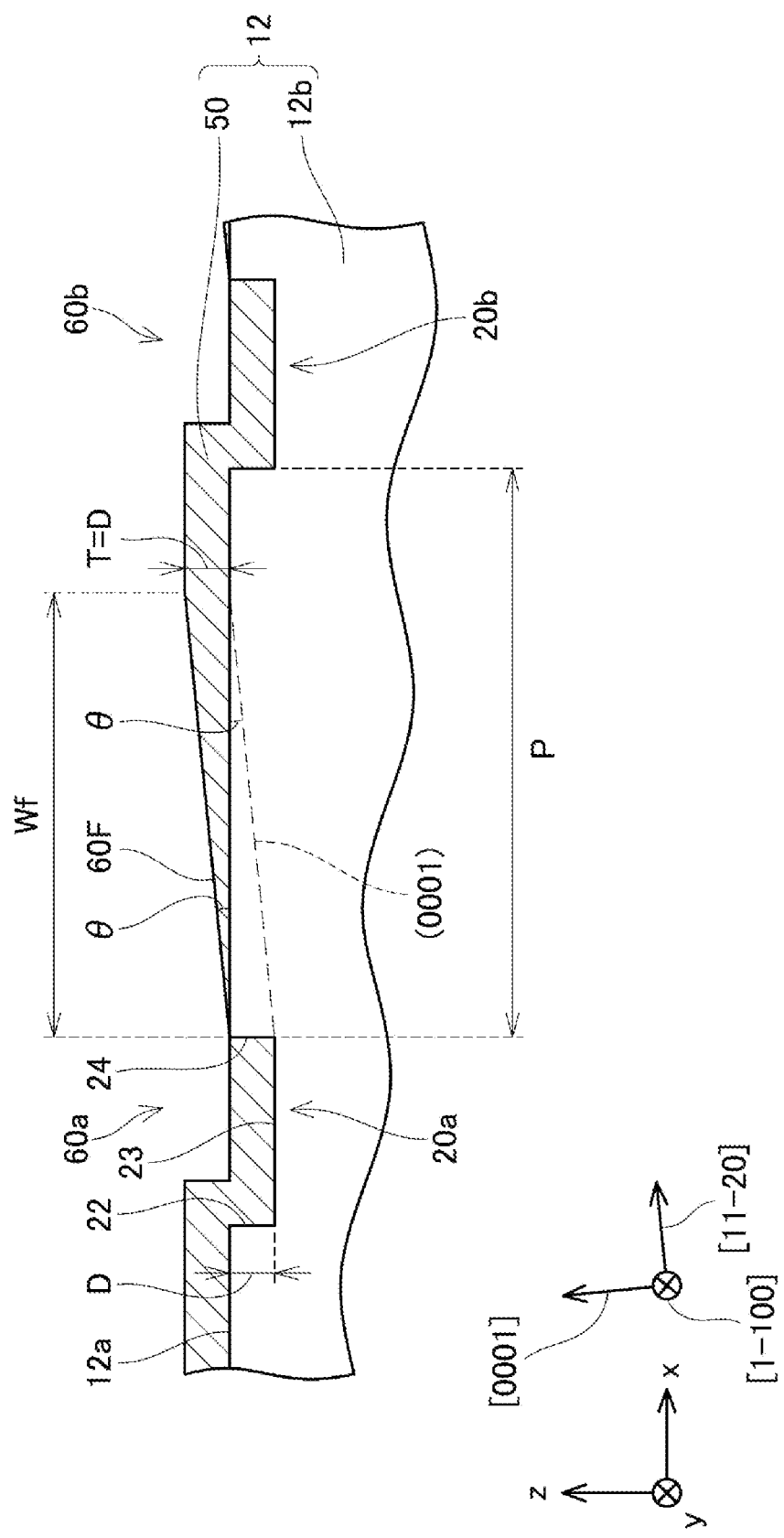
FIG. 15 is a cross-sectional view illustrating a process in the epitaxial growth process, subsequent to the process illustrated in FIG. 14.

When the film thickness T is further increased from the state of FIG. 14, the film thickness T reaches the depth D of the alignment marks 20 as illustrated in FIG. 15. Then, the alignment marks 20 are filled with the SiC layer 50. In this state (that is, T=D), the width Wf of the facet surface 60F relatively accurately satisfies the relationship of Wf=D/tan θ.

Figure 16:
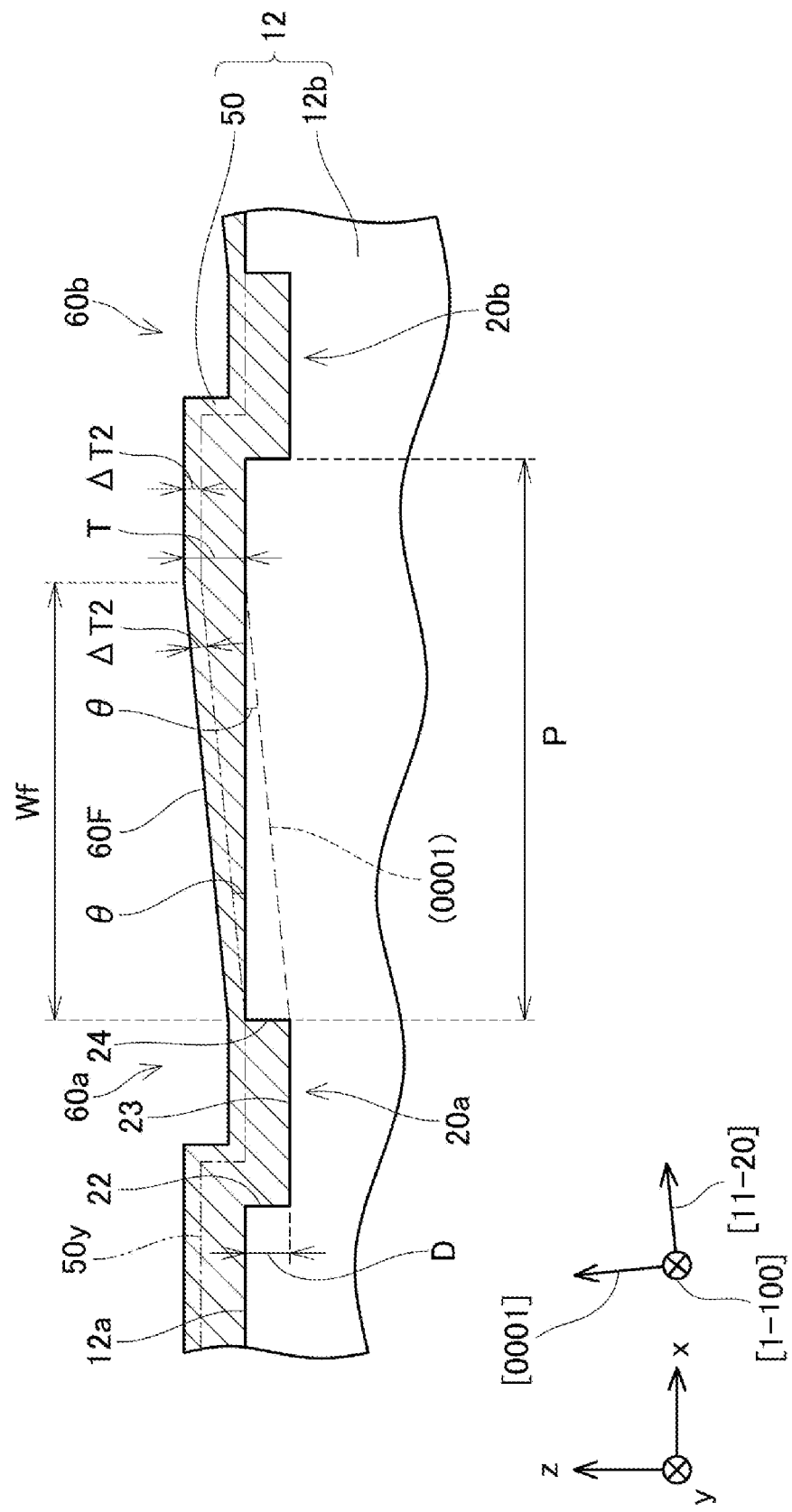
FIG. 16 is a cross-sectional view illustrating a process in the epitaxial growth process, subsequent to the process illustrated in FIG. 15.

When the film thickness T is further increased from the state illustrated in FIG. 15, the SiC layer 50 grows as illustrated in FIG. 16. In FIG. 16, a virtual line 50y represents the surface of the SiC layer 50 in the state of FIG. 15, and a thickness film increase amount ΔT2 indicates a film thickness increased from the state of FIG. 15. As indicated by the film thickness increase amount ΔT2 in FIG. 16, the SiC layer 50 grows substantially uniformly over the entire surface after the alignment marks 20 are filled. In other words, the SiC layer 50 grows on the facet surface 60F with a uniform film thickness similar to that on the other surfaces. When the SiC layer 50 grows in this way, even if the film thickness T of the SiC layer 50 increases, the width Wf of the facet surface 60F hardly changes. Therefore, when the film thickness T is larger than the depth D, even if the film thickness T increases, the width Wf of the facet surface 60F hardly changes. Therefore, when the film thickness T is larger than the depth D, the width Wf of the facet surface 60F relatively accurately satisfies the relationship Wf=D/tan θ.

As described above, when the film thickness T is smaller than the depth D (that is, in the states of FIGS. 13 and 14), the width Wf of the facet surface 60F can be relatively accurately satisfies the relationship of Wf=T/tan θ. In this case, since T<D, the width Wf relatively accurately satisfies the relationship Wf<D/tan θ. Also, when the film thickness T is larger than or equal to the depth D (that is, in the states of FIGS. 15 and 16), the width Wf relatively accurately satisfies the relationship Wf=D/tan θ. Therefore, normally, regardless of the film thickness T, the width Wf is not larger than the width W calculated by the equation of W=D/tan θ. Therefore, by making the interval P in the x-direction between the alignment marks 20a and 20b larger than the width W calculated by the above equation, it is possible to restrict the facet surface 60F of the alignment mark 60a from interfering with the alignment mark 60b.

Note that the actual width Wf of the facet surface 60F may be larger than the calculated width W due to the influence of manufacturing conditions and the like. Therefore, it is preferable to set the interval P with a margin with respect to the calculated width W. However, if the interval P is increased more than necessary with respect to the calculated width W, the area occupied by the plurality of alignment marks 20 becomes large, which causes a decrease in the number of semiconductor devices manufactured from the SiC substrate 12. In addition, when the area occupied by the plurality of alignment marks 20 becomes large, a photographing magnification when photographing the plurality of alignment marks with an alignment camera becomes small, and an alignment accuracy deteriorates. According to various experiments conducted by the inventors, it has been found that the actual width Wf of the facet surface 60F does not reach ten times the calculated width W. Therefore, if the interval P is set so as to satisfy the relationship of W<P<10W (that is, the relationship of D/tan θ<P<10D/tan θ), it is possible to restrict an interference of the facet surface 60F of the alignment mark 60 with the adjacent alignment mark 60 and an expansion of the area occupied by the alignment marks 20. In the manufacturing method of the first embodiment, since the interval P satisfies the relationship of W<P<10W, it is possible to restrict the interference of the facet surface 60F of the alignment mark 60 with the adjacent alignment mark 60 and the expansion of the area occupied by the alignment marks 20.

In the manufacturing method of the first embodiment, an alignment process using the alignment marks 60 is performed after the epitaxial growth process. For example, alignment is performed using the alignment marks 60, and etching, ion implantation, or the like may be performed on the SiC layer 50, semiconductor layers other than the SiC layer 50, or other layers such as electrode layers, insulating layers, or the like. For example, when ions are implanted into the grown SiC layer 50, alignment may be performed using the alignment marks 60 to precisely form opening portions in an ion implantation mask, and ions may be implanted into the SiC layer 50 through the ion implantation mask. Since the facet surface 60F of the alignment mark 60 does not interfere with other alignment marks 60, alignment using the alignment marks 60 can be properly performed. Moreover, since the interval P between the alignment marks 60 is relatively narrow, the magnification can be increased when photographing the alignment marks 60 with the alignment camera. Therefore, the alignment can be performed with high accuracy.

After that, the SiC substrate 12 is diced and divided into multiple pieces, thereby manufacturing multiple semiconductor devices.

The semiconductor wafer (that is, SiC substrate 12) illustrated in FIG. 16 has the following configuration. The semiconductor wafer (that is, the SiC substrate 12) has the base substrate 12b and an epitaxial layer (that is, the SiC layer 50). The base substrate 12b has the upper surface 12a on which the alignment mark 20a having the recessed shape is disposed. As illustrated in FIG. 2, the perpendicular line 12s that is perpendicular to the upper surface 12a is inclined with respect to the direction toward the [11-20] direction. As illustrated in FIG. 16, the epitaxial layer (that is, the SiC layer 50) is disposed on the upper surface 12a of the base substrate 12b and covers the alignment marks 20a. On the upper surface 12a of the base substrate 12b, the alignment mark 20b having the recessed shape is disposed as a structure. The structure (that is, the alignment mark 20b) is arranged at a position apart from the alignment mark 20a by the interval P in the [11-20] direction along the upper surface 12a of the base substrate 12b. The interval P satisfies the relationship of $D/\tan\theta < P < 10D/\tan\theta$, where D is the depth of the alignment mark 20a and θ is the inclination angle (that is, the off angle) of the perpendicular line 12s that is perpendicular to the upper surface 12a with respect to the [0001] direction. Therefore, in this semiconductor wafer, the facet surface 60F of the alignment mark 60a does not interfere with the alignment mark 60b, and proper alignment can be performed using the alignment mark 60a. That is, by using this semiconductor wafer, semiconductor devices can be appropriately manufactured.

Second Embodiment

Figure 17:
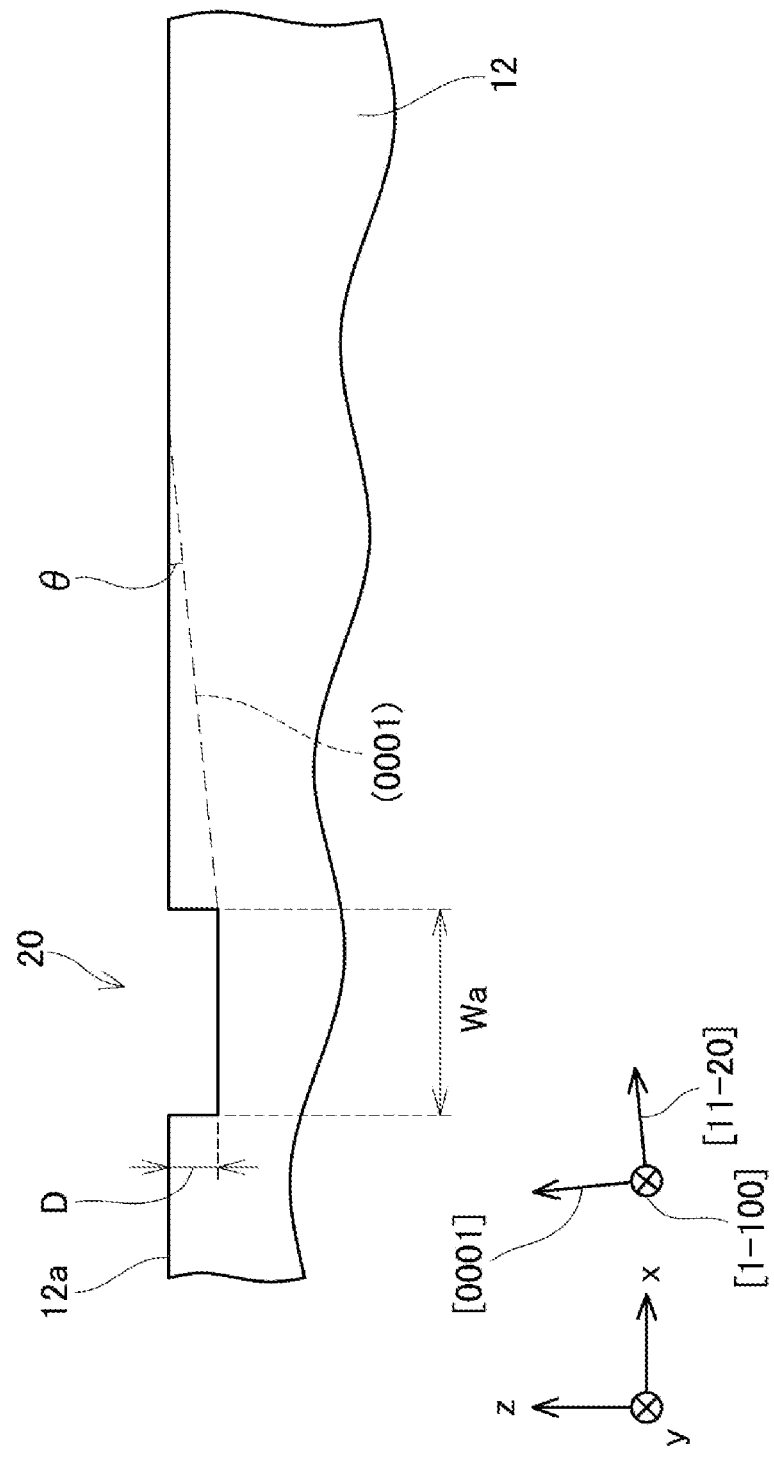
FIG. 17 is an enlarged cross-sectional view illustrating an alignment mark according to a second embodiment.
Figure 18:
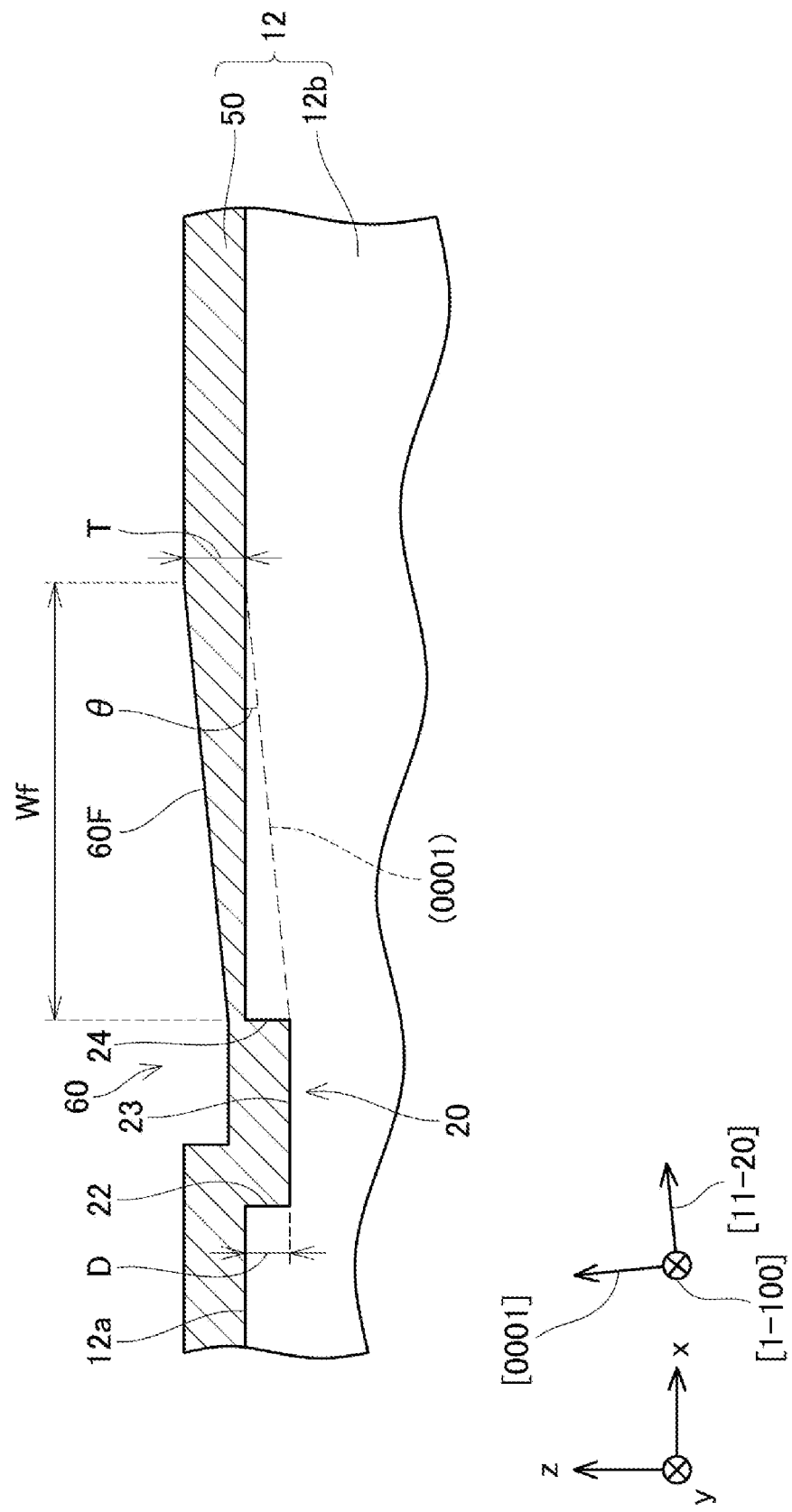
FIG. 18 is a cross-sectional view illustrating an epitaxial growth process according to the second embodiment.

In a manufacturing method of a second embodiment, semiconductor devices are manufactured from the SiC substrate 12 illustrated in FIGS. 1 and 2, as in the first embodiment. In this manufacturing method, an alignment mark 20 having a recessed shape is formed on the upper surface 12a of the SiC substrate 12 in a manner similar to that in the first embodiment. For example, as illustrated in FIG. 17, an alignment mark 20 having a depth D smaller than a width Wa is formed. Next, as illustrated in FIG. 18, a SiC layer 50 is epitaxially grown on the SiC substrate 12 (that is, the base substrate 12b) so as to cover the alignment mark 20. Accordingly, an alignment mark 60 following the shape of the alignment mark 20 is formed on an upper surface of the SiC layer 50. In addition, a facet surface 60F is formed at a position adjacent to the alignment mark 60 in the [11-20] direction.

Figure 19:
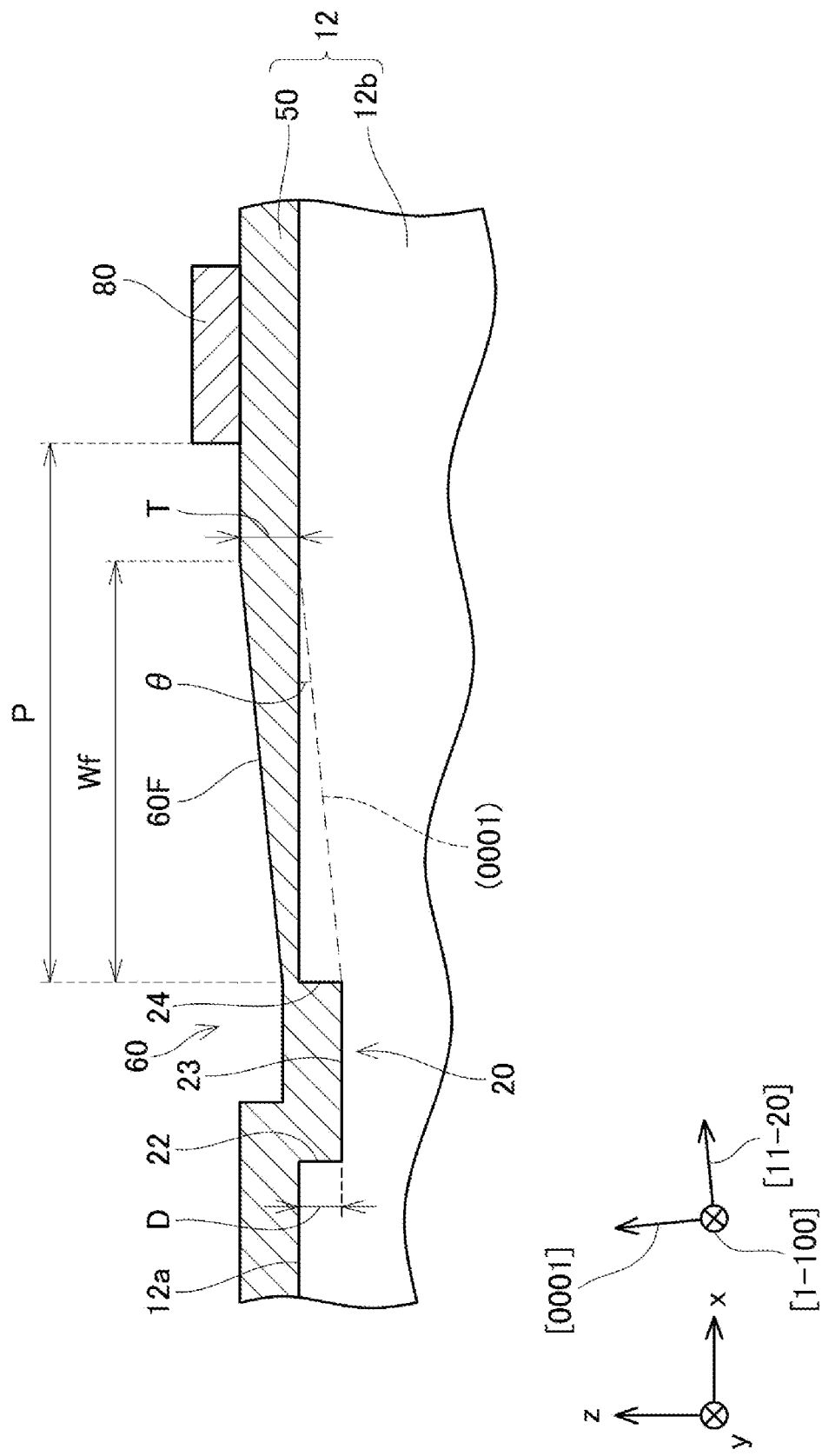
FIG. 19 is a cross-sectional view illustrating a structure formation process according to the second embodiment.

Next, as illustrated in FIG. 19, a structure 80 having a protruding shape is formed on the upper surface of the SiC substrate 12 (that is, the upper surface of the SiC layer 50). Note that the structure 80 may be a conductor, an insulator, or a semiconductor. The structure 80 may be a part of a semiconductor device or a part of a mask. In the present embodiment, the structure 80 having a protruding shape is formed at a position apart from the alignment mark 20 in the [11-20] direction. Between the alignment mark 20 and the structure 80, an interval P is provided. The interval P is set so as to satisfy a relationship of $W < P < 10W$, that is, a relationship of $D/\tan\theta < P < 10D/\tan\theta$. Accordingly, interference between the structure 80 and the facet surface 60F can be restricted without increasing the interval between the structure 80 and the alignment mark 20 more than necessary.

After that, an alignment process using the alignment mark 60 is performed. Since the facet surface 60F of the alignment mark 60 does not interfere with the structure 80, alignment using the alignment mark 60 can be properly performed.

After that, the SiC substrate 12 is diced and divided into multiple pieces, thereby manufacturing multiple semiconductor devices.

The semiconductor wafer (that is, SiC substrate 12) illustrated in FIG. 19 has the following configuration. The semiconductor wafer (that is, the SiC substrate 12) has the base substrate 12b and an epitaxial layer (that is, the SiC layer 50). The base substrate 12b has the upper surface 12a on which the alignment mark 20 having the recessed shape is provided. As illustrated in FIG. 2, the perpendicular line 12s that is perpendicular to the upper surface 12a is inclined with respect to the [0001] direction toward the [11-20] direction. As illustrated in FIG. 19, the epitaxial layer (that is, the SiC layer 50) is disposed on the upper surface 12a of the base substrate 12b and covers the alignment mark 20. The structure 80 is disposed on the upper surface of the epitaxial layer (that is, the SiC layer 50). The structure 80 is disposed at a position apart from the alignment mark 20 by the interval P in the [11-20] direction on the upper surface 12a of the base substrate 12b. The interval P satisfies the relationship of $D/\tan\theta < P < 10D/\tan\theta$, where D is the depth of the alignment mark 20a and θ is the inclination angle (that is, the off angle) of the perpendicular line 12s that is perpendicular to the upper surface 12a with respect to the [0001] direction. Therefore, in this semiconductor wafer, the facet surface 60F does not interfere with the structure 80, and proper alignment can be performed using the alignment mark 60.

Figure 20:
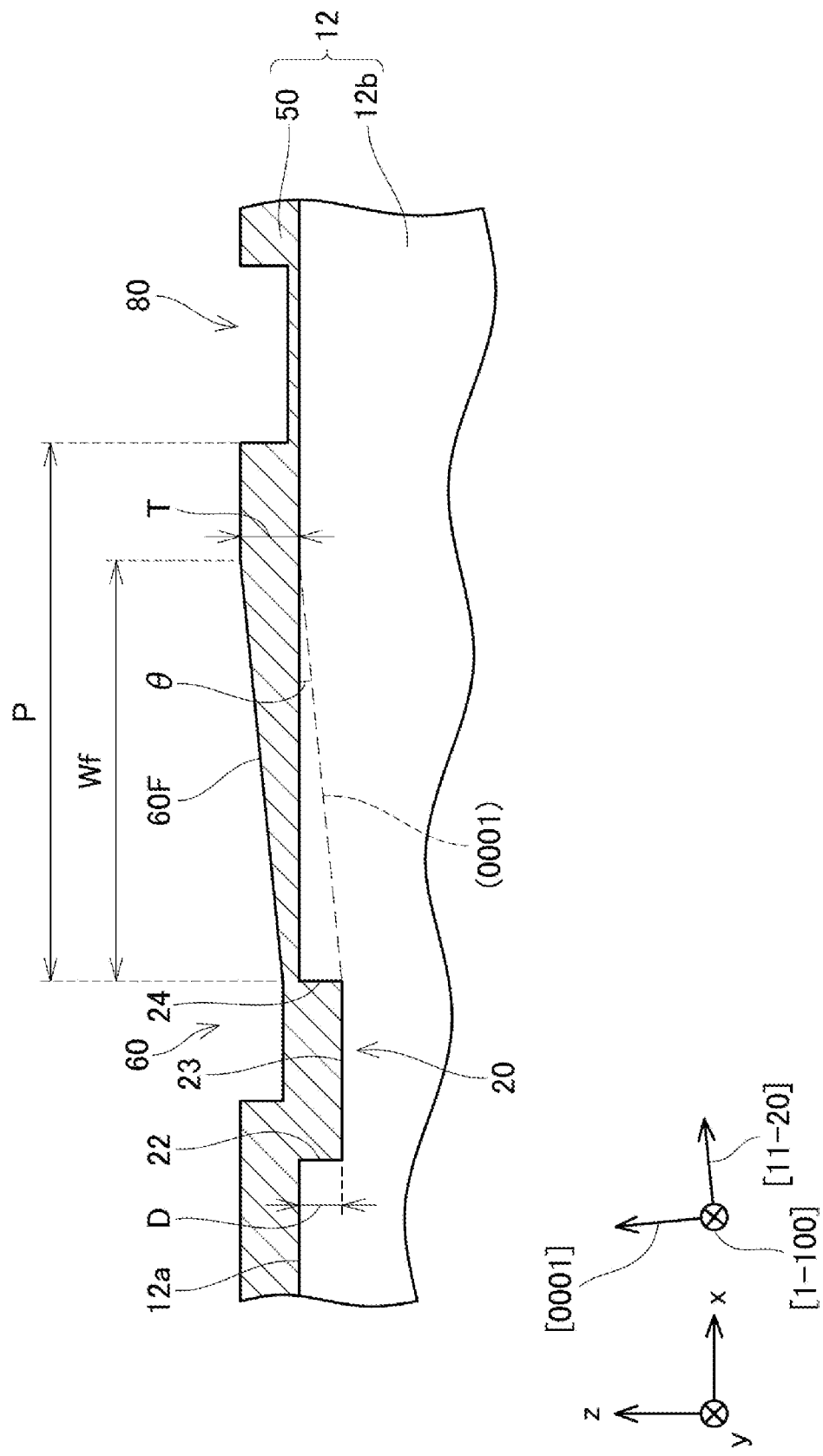
FIG. 20 is a cross-sectional view illustrating a structure formation process according to a modification of the second embodiment.

In the second embodiment described above, the structure 80 is a protruding portion disposed on the upper surface of the SiC layer 50. However, as illustrated in FIG. 20, the structure 80 may also be a recessed portion disposed on the upper surface of the SiC layer 50. This configuration can also restrict interference between the structure 80 and the facet surface 60F.

Figure 21:
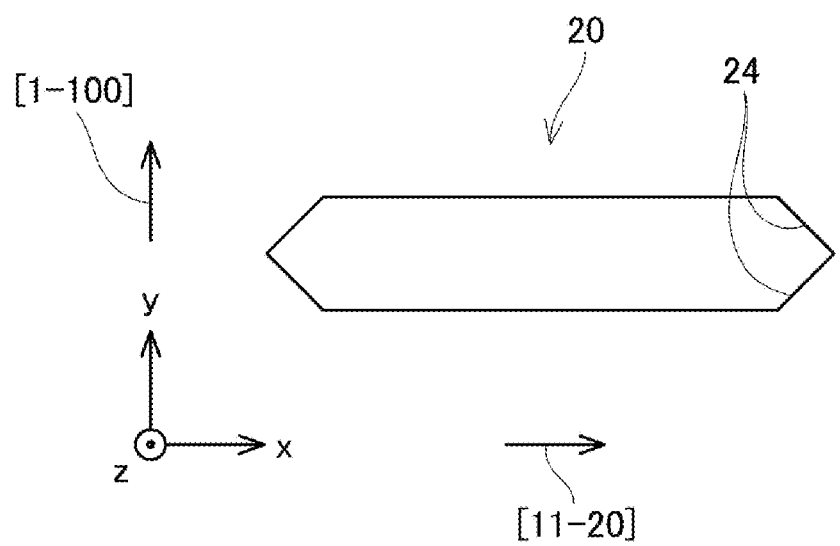
FIG. 21 is a plan view illustrating an alignment mark formed on an upper surface of a SiC substrate according to a modification.

In the first and second embodiments described above, each of the alignment marks 20 has a rectangular shape on the upper surface 12a of the SiC substrate 12. Each of the alignment mark 20 may also have other shapes. In these cases, a side surface of each of the alignment mark 20 located in the [11-20] direction does not have to be perpendicular to the [11-20] direction. For example, as illustrated in FIG. 21, a side surface 24 (that is, an edge portion) of each of the alignment mark located in the [11-20] direction may extend along a direction diagonally intersecting the [11-20] direction.

In the first and second embodiments described above, the SiC layer 50 is grown so that the thickness T of the SiC layer 50 is larger than the depth D of the alignment mark 20. Alternatively, the SiC layer 50 may be grown so that the thickness T of the SiC layer 50 is less than the depth D of the alignment mark 20. Even in this case, by setting the interval P so as to satisfy the relationship of $D/\tan\theta < P < 10D/\tan\theta$, interference of the facet surface 60F with other structures can be restricted without increasing the interval P more than necessary.

In the first and second embodiments described above, the alignment marks 20 are formed. Alternatively, the SiC substrate 12 formed in advance with the alignment marks 20 that satisfies the relationship of $D/\tan\theta < P < 10D/\tan\theta$ may be purchased and brought into a manufacturing facility. Even if the same epitaxial growth process and alignment process as in the first and second embodiments are performed on the SiC substrate 12 on which the alignment marks 20 are formed in advance, the same effect as in the first and second embodiments can be obtained.

The SiC layer 50 in the first and second embodiments is an example of the epitaxial layer. The alignment marks 20a, 20 in the first and second embodiments are examples of the first alignment mark. The alignment mark 20b in the first embodiment is an example of the structure having a recessed shape formed on the upper surface of the SiC substrate before forming the epitaxial layer. The structure 80 of the second embodiment is an example of the structure having a protruding shape or a recessed shape formed on the upper surface of the epitaxial layer. The alignment marks 60a and 60 of the first and second embodiments are examples of the second alignment mark.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A manufacturing method of a semiconductor device, comprising:

preparing a silicon carbide substrate that has an upper surface on which an alignment mark having a recessed shape is disposed, a perpendicular line that is perpendicular to the upper surface of the silicon carbide substrate being inclined with respect to a [0001] direction toward a [11-20] direction;

growing an epitaxial layer on the upper surface of the silicon carbide substrate so as to cover the alignment mark; and forming a structure on or above the upper surface of the silicon carbide substrate, wherein the structure is formed at a position apart from the alignment mark by an interval P in the [11-20] direction along the upper surface of the silicon carbide substrate, and the interval P satisfies a relationship of D/tan θ<P<10D/tan θ, where D is a depth of the alignment mark and θ is an inclination angle of the perpendicular line with respect to the [0001] direction.

2. The manufacturing method according to claim 1, wherein the forming the structure includes forming the structure having a recessed shape on the upper surface of the silicon carbide substrate before the growing the epitaxial layer.

3. The manufacturing method according to claim 1, wherein the forming the structure includes forming the structure having a protruding shape or a recessed shape on an upper surface of the epitaxial layer.

4. The manufacturing method according to claim 1, wherein when the upper surface of the silicon carbide substrate is viewed from above, an edge portion of the alignment mark located in the [11-20] direction is perpendicular to the [11-20] direction.

5. The manufacturing method according to claim 1, wherein the alignment mark is a first alignment mark, the growing the epitaxial layer includes forming a second alignment mark on an upper surface of the epitaxial layer, the second alignment mark having a recessed shape following the recessed shape of the first alignment mark, and the manufacturing method further comprising performing alignment using the second alignment mark.

6. A semiconductor wafer comprising:

a base substrate made of silicon carbide and having an upper surface on which an alignment mark having a recessed shape is disposed, a perpendicular line that is perpendicular to the upper surface of the base substrate being inclined with respect to a [0001] direction toward a [11-20] direction;

an epitaxial layer disposed on the upper surface of the base substrate and covering the alignment mark; and a structure disposed on the upper surface of the base substrate or an upper surface of the epitaxial layer, wherein the structure is disposed at a position apart from the alignment mark by an interval P in the [11-20] direction along the upper surface of the base substrate, and the interval P satisfies a relationship of D/tan θ<P<10D/tan θ, where D is a depth of the alignment mark and θ is an inclination angle of the perpendicular line with respect to the [0001] direction.

7. The semiconductor wafer according to claim 6, wherein the structure is a recessed portion disposed on the upper surface of the base substrate.

8. The semiconductor wafer according to claim 6, wherein the structure is a protruding portion or a recessed portion disposed on the upper surface of the epitaxial layer.

9. The semiconductor wafer according to claim 6, wherein when the upper surface of the base substrate is viewed from above, an edge portion of the alignment mark located in the [11-20] direction is perpendicular to the [11-20] direction.

10. The semiconductor wafer according to claim 6, wherein the alignment mark is a first alignment mark, and the upper surface of the epitaxial layer has a second alignment mark that has a recessed shape following the recessed shape of the first alignment mark.

* * * * *